(12) United States Patent
Kim et al.

(10) Patent No.: US 7,449,357 B2
(45) Date of Patent: Nov. 11, 2008

(54) METHOD FOR FABRICATING IMAGE SENSOR USING WAFER BACK GRINDING

(75) Inventors: Eun-Ji Kim, Chungcheongbuk-do (KR); Kyoung-Kuk Kwon, Chungcheongbuk-do (KR)

(73) Assignee: MagnaChip Semiconductor, Ltd. (KR)

( * ) Notice: Subject to any disclaimer, the term of this patent is extended or adjusted under 35 U.S.C. 154(b) by 147 days.

(21) Appl. No.: 11/399,941

(22) Filed: Apr. 6, 2006

(65) Prior Publication Data

US 2006/0228826 A1 Oct. 12, 2006

Related U.S. Application Data

(60) Provisional application No. 60/669,198, filed on Apr. 6, 2005.

(51) Int. Cl.
H01L 21/00 (2006.01)
(52) U.S. Cl. .................... 438/57; 438/57; 438/107; 438/188; 257/E27.046; 257/E33.068
(58) Field of Classification Search ............... 438/57, 438/107, 188; 257/E27.046, E33.068, 98; 359/454
See application file for complete search history.

(56) References Cited

U.S. PATENT DOCUMENTS

| | | | |
|---|---|---|---|
| 2006/0011932 A1* | 1/2006 | Kim ........................... | 257/98 |
| 2006/0050379 A1* | 3/2006 | Yee et al. ................... | 359/454 |
| 2006/0057775 A1* | 3/2006 | Saho et al. ................. | 438/108 |

* cited by examiner

Primary Examiner—Walter Lindsay, Jr.
Assistant Examiner—Abdulfattah Mustapha
(74) Attorney, Agent, or Firm—Blakely, Sokoloff, Taylor & Zafman

(57) ABSTRACT

Provided is a method for fabricating an image sensor using a wafer back grinding process. The method includes: forming a microlens protection layer over a substrate structure including a light sensing device and other associated devices; opening a pad open unit of the substrate structure using a mask; removing the mask; forming a photoresist layer over the substrate structure with the microlens protection layer; gluing a tape on the photoresist layer; performing a wafer back grinding process; and removing the tape and the photoresist layer.

6 Claims, 11 Drawing Sheets

METHOD FOR FABRICATING IMAGE SENSOR USING WAFER BACK GRINDING

This application relies for priority upon U.S. Provisional Patent Application No. 60/669,198 filed on Apr. 6, 2005, the contents of which are herein incorporated by reference in its entirety.

FIELD OF THE INVENTION

The present invention relates to a method for fabricating an image sensor; and more particularly, to a method for fabricating an image sensor using a wafer back grinding process.

DESCRIPTION OF RELATED ARTS

Generally, image sensors convert an optical image into an electric signal. There are two types of an image sensor: a charge coupled device and complementary metal oxide semiconductor (CMOS) image sensor. In charge coupled devices (CCD), charge carriers are stored into or transferred from metal oxide semiconductor (MOS) capacitors closely disposed to each other. In CMOS image sensors (CIS), using CMOS technology including a control circuit and a signal processing circuit as a peripheral circuit, MOS transistors are prepared as many as the number of pixels, and outputs are sequentially detected using the MOS transistors. This detection is called "switching."

A typical image sensor includes a light sensing unit, which senses light and a logic circuit unit, which processes sensed light into an electric signal and then into a data. A recent attempt is to increase a fill factor, which is a percentage of an area of a light sensing unit over the entire image sensor area.

However, the logic circuit unit cannot be eliminated, and thus, such an attempt to increase the fill factor within the confined area becomes limited. For this reason, light integration technology has been introduced to integrate light impinging on regions other than the light sensing unit. For the integration of impinging light, image sensors generally include color filters with microlenses.

FIG. 1 is a circuit diagram illustrating a unit pixel of a conventional CMOS image sensor with one photodiode and four transistors.

The unit pixel includes a photodiode 100, a transfer transistor 101, a floating diffusion region 102, a reset transistor 103, a drive transistor 104, and a select transistor 105. The photodiode 100 senses light and then generates photo-generated charges, and the transfer transistor 101 transfers the photo-generated charges collected at the photodiode 100 to the floating diffusion region 102. The reset transistor 103 sets a potential of the floating diffusion region 102 with an intended value, and discharges charges to reset the floating diffusion region 102. The drive transistor 104 serves as a source follower amplifier and the select transistor 105 can perform a switching and addressing function. Also, a load transistor 106 is provided outside the unit pixel to read out an output signal.

FIGS. 2A to 2C are cross-sectional views illustrating a method for fabricating a conventional CMOS image sensor including a unit pixel configured as above and color filters with microlenses.

Referring to FIG. 2A, field oxide layers 11 defining a filed region and an active region are formed over a substrate 10. A P-type well 12 and an N-type well 13 are formed using an ion implantation mask. Gate electrodes 14 and gate spacers 15 are formed over predetermined regions of the substrate 10. Unit pixels 16 including photodiodes are formed in a light sensing region, and N-type ion implantation regions 17 and P-type ion implantation regions 18, each with lightly doped drain (LDD) regions are formed. The N-type and P-type ion implantation regions 17 and 18 correspond to source/drain regions of transistors.

An inter-layer insulation layer 19 is formed over the above resultant structure, and a plurality of first metal lines 20 are formed thereon through a patterning process. Afterwards, a plurality of second metal lines 22, a first inter-metal insulation layer 21, a plurality of third metal lines 24, and a second inter-metal insulation layer 23 are formed sequentially over the above resultant structure where the first metal lines 20 are formed.

A passivation layer 25 is formed over the third metal lines 24 and the second inter-metal insulation layer 23 to protect devices from moisture or scratches. A material for forming color filters is formed over the passivation layer 25 and patterned using a mask to form color filters 26. Particularly, the color filters 26 are formed over certain regions of the passivation layer 25 corresponding to the unit pixels 16 in the light sensing region.

A planarization layer 27 is formed over a predetermined region of the passivation layer 25 to reduce a height difference created when the color filters 26 are formed, and microlenses 28 are formed over the planarization layer 27. A microlens protection layer 29 is formed over the entire surface of the above resultant structure to protect the microlenses 28.

Then, a pad opening process is performed to open a pad open unit PO. More specifically, a photoresist pattern 30 is formed over a certain portion of the microlens protection layer 29 to expose the pad open unit PO. Using the photoresist pattern 30, the microlens protection layer 29 and the passivation layer 25 are sequentially etched to expose the third metal lines 24.

Referring to FIG. 2B, the photoresist pattern 30 is removed, and a taping process which glues a tape 31 on the entire resultant structure is performed thereafter. The taping process is to reduce contamination caused by particles X generated during a wafer back grinding process 100. Hereinafter, the wafer back grinding process 100 will be briefly described.

The wafer back grinding process 100 grinds a rear surface of an image sensor chip to a certain thickness, so that a distance between optical lenses and external modules can be adjusted appropriately. After the image sensor chip is completed with a wire bonding process, glass is overlaid to protect the image sensor chip against factors causing defects in chip operation, thereby completing a packaging process.

After the packaging process, a plastic device including an external lens is adhered on top of the packaged device and mounted on a print circuit board to be fabricated as one module. This module is implemented into a product like a camera.

As mentioned above, the wafer back grinding process 100 is performed to adjust a focusing length between an image sensor chip and an external lens. However, during the wafer back grinding process 100, lots of particles X are generated, and thus, it is necessary to develop a method for reducing the particle generation. One approach is to perform a taping process. As illustrated in FIG. 2B, the taping process is performed using the tape 31 after the removal of the photoresist pattern 30. If the wafer back grinding process 100 is performed after the taping process, particles X tend to adhere on the tape 31 without affecting the image sensor chip. In addition to the given function of the tape 31 as a protector of the patterns formed over the entire wafer, the tape 31 adsorbs physical force to thereby prevent the wafer from being broken. The tape 31 is removed therafter.

However, the aforementioned taping process may have several disadvantages. As illustrated in FIG. 2C, since the tape 31 has a certain level of adhesion pressure, the microlens protection layer 29 is likely to crack when the tape 31 is removed. Reference denotation C denotes this crack event. Also, adhesive residues Y of the tape 31 may remain on the entire wafer, thereby decreasing device yield.

Hence, another approach has been proposed to overcome the above disadvantages, and will be described in detail with reference to FIGS. 3A to 3C. Herein, the same reference numerals represent the same elements described in FIGS. 2A to 2C, and detailed description thereof will be omitted.

A structure illustrated in FIG. 3A is obtained after a pad opening process is performed using a photoresist pattern 30. A taping process is performed in the presence of the photoresist pattern 30. As illustrated in FIG. 3B, the photoresist pattern 30 is formed over a certain region of a microlens protection layer 29, and a tape 31 is glued thereon. If a wafer back grinding process 100 is performed while the tape 31 is glued on the structure, particles X tend to adhere on the tape 31 without affecting the patterns over the wafer.

Since the photoresist pattern 30 remains and the tape 31 is glued thereon, the microlens protection layer 29 is less likely to be cracked even when the tape 31 is removed. As described above, the crack usually occurs due to an adhesion pressure from the tape 31. Also, as illustrated in FIG. 3C, when the photoresist pattern 30 is removed, adhesive residues Y of the tape 31 remaining on the photoresist pattern 30 are removed simultaneously. As a result, the reduction in device yield can be impaired. Yet, this proposed method may have disadvantages.

As illustrated in FIG. 3B, the tape 31 (in liquid type) is filled into a pad open unit PO while the rest regions are protected by the photoresist pattern 30. Thus, when the tape 31 is removed, the microlens protection layer 29 may be cracked or lifted up at certain portions A of the pad open unit PO.

As mentioned above, after the wafer back grinding process 100, lots of the adhesive residues Y of the tape 31 remain on the photoresist pattern 30 (refer to FIG. 3B). Under this state, the photoresist pattern 30 is removed. The removal of the photoresist pattern 30 proceeds with a stripping process using a plasma. However, since this plasma stripping process strips the photoresist pattern 30 as the wafers are loaded one by one for the plasma stripping process. Thus, the wafers may be broken easily.

More specifically, after the wafer back grinding process, the total thickness of the wafer becomes reduced by one half. Thus, the wafers with the reduced thickness are picked up one by one by an arm of a designated apparatus for the plasma stripping process, the wafers are more likely to be broken during the plasma stripping process.

SUMMARY OF THE INVENTION

It is, therefore, an object of the present invention to provide a method for fabricating an image sensor advantageous of reducing contamination by particles and cracks on a microlenses protection layer through forming an additional photoresist pattern after removing a photoresist pattern for opening a pad open unit and then performing a taping process.

In accordance with an aspect of the present invention, there is provided a method for fabricating an image sensor including: forming a microlens protection layer over a substrate structure including a light sensing device and other associated devices; opening a pad open unit of the substrate structure using a mask; removing the mask; forming a photoresist layer over the substrate structure with the microlens protection layer; gluing a tape on the photoresist layer; performing a wafer back grinding process; and removing the tape and the photoresist layer.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

Hereinafter, exemplary embodiments of the present invention will be described in detail with reference to the accompanying drawings.

FIGS. 4A to 4D are cross-sectional views illustrating a method for fabricating an image sensor in accordance with an embodiment of the present invention.

Figure 4A:
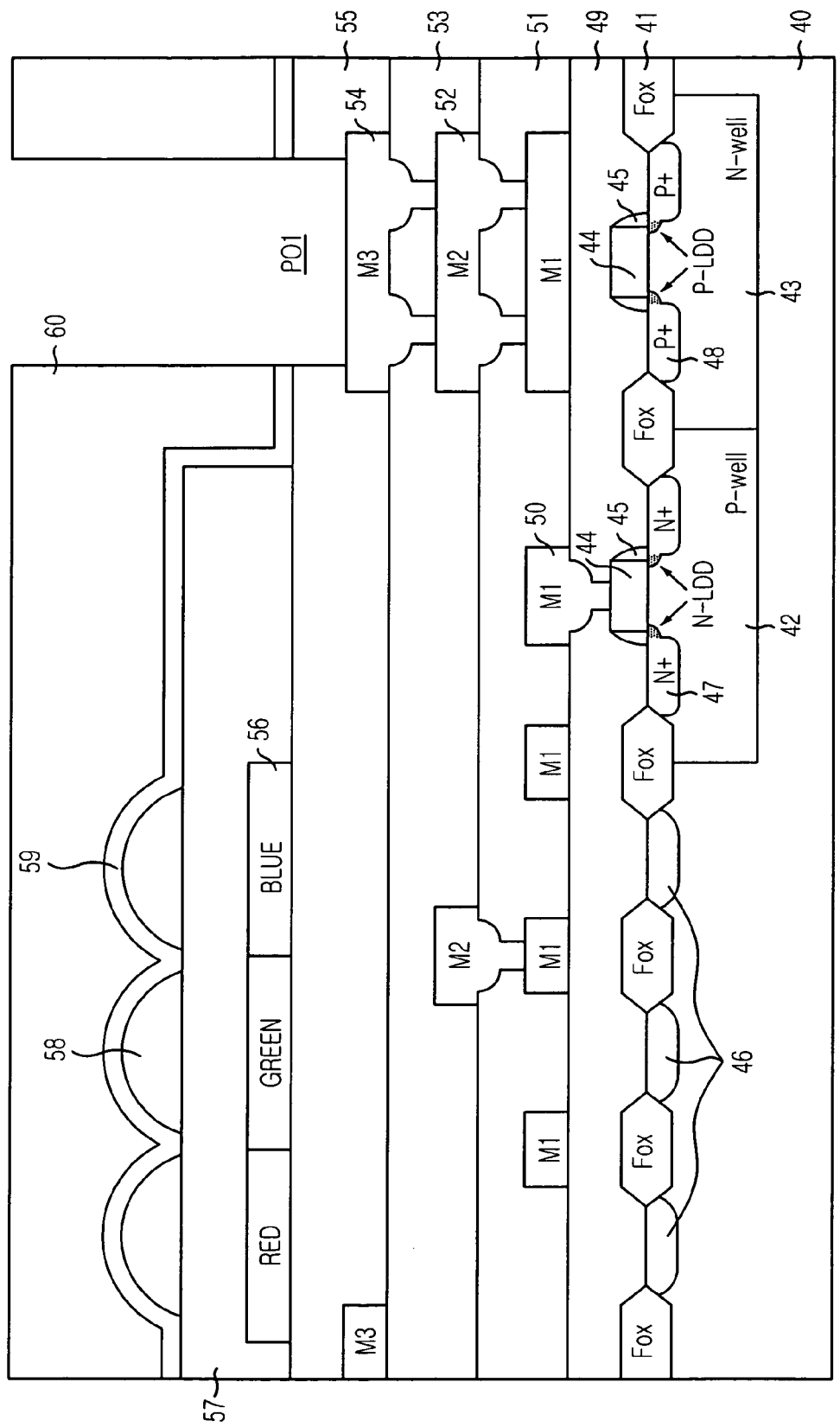
FIGS. 4A to 4D are cross-sectional views illustrating a method for fabricating an image sensor in accordance with an embodiment of the present invention.

Referring to FIG. 4A, field oxide layers 41 defining a filed region and an active region are formed over a substrate 40. A P-type well 42 and an N-type well 43 are formed using an ion implantation mask. Gate electrodes 44 and gate spacers 45 are formed over predetermined regions of the substrate 40. Unit pixels 46 including photodiodes are formed in a light sensing region, N-type ion implantation regions 47 and P-type ion implantation regions 48 with lightly doped drain (LDD) regions are formed. The N-type ion implantation regions 47 and P-type ion implantation regions 48 correspond to source/drain regions of transistors.

An inter-layer insulation layer 49 is formed over the above resultant structure, and a plurality of first metal lines 50 are formed thereon through a patterning process. Afterwards, a plurality of second metal lines ~52, a first inter-metal insulation layer 51, a plurality of third metal lines 54, and a second inter-metal insulation layer 53 are formed sequentially over the above resultant structure where the first metal lines 50 are formed.

A passivation layer 55 is formed over the third metal lines 54 and the second inter-metal insulation layer 53 to protect devices from moisture or scratches. A material for forming color filters is formed over the passivation layer 55 and patterned using a mask to form color filters 56. Particularly, the color filters 56 are formed over certain regions of the passivation layer 55 corresponding to the unit pixels 56 of the light sensing region.

A planarization layer 57 is formed to reduce a height difference created by the formation of the color filters 56, and microlenses 58 are formed over the planarization layer 57. A microlens protection layer 59 is formed over the entire surface of the above resultant structure to protect the microlenses 58.

Then, a pad opening process is performed to open a pad open unit PO1. More specifically, a photoresist pattern 60 is formed over a certain region of the microlens protection layer 59 to expose the pad open unit PO1. Using the photoresist pattern 60, the microlens protection layer 59 and the passivation layer 55 are sequentially etched to expose the third metal lines 54.

Figure 4B:
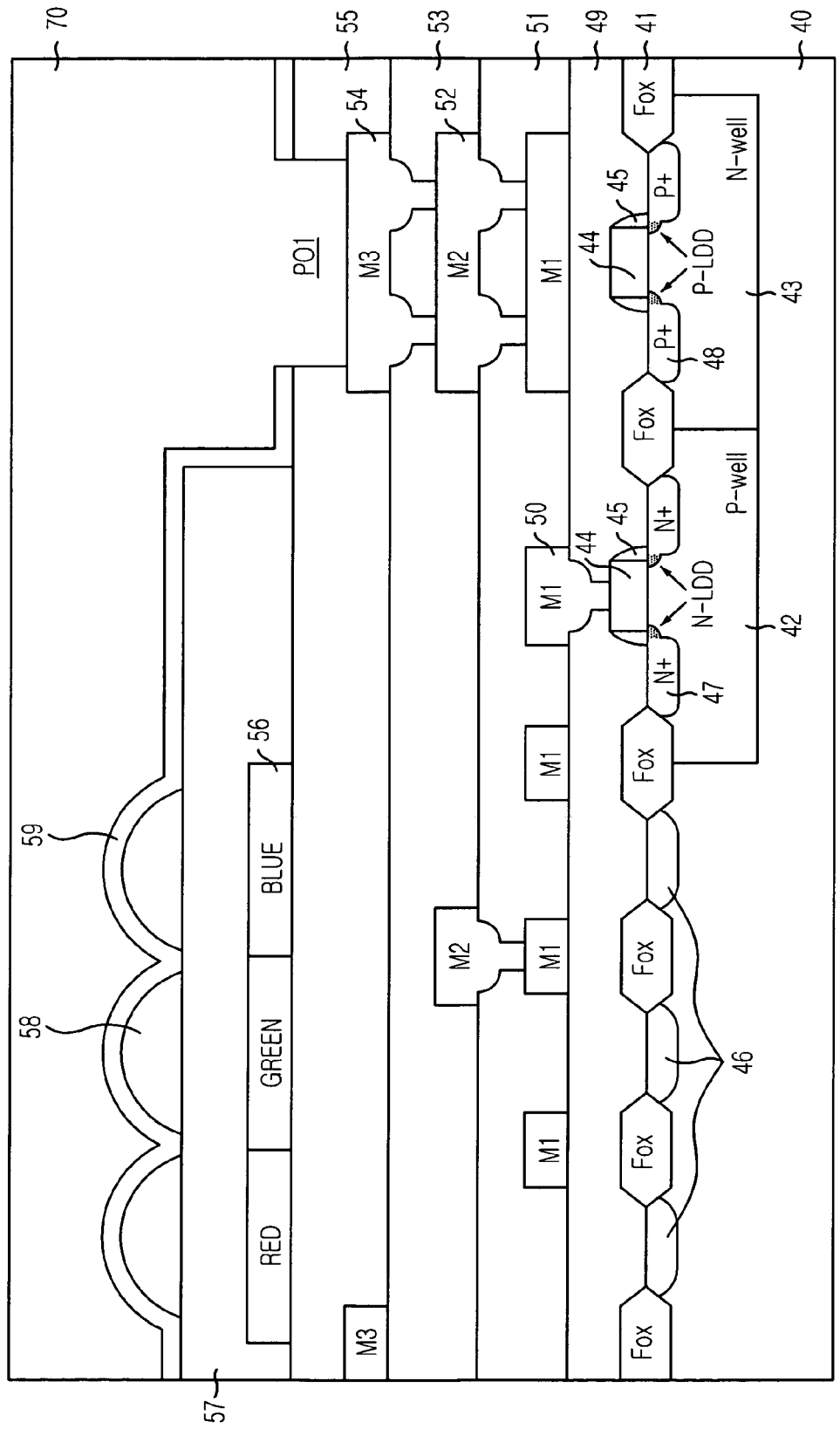

Referring to FIG. 4B, the photoresist pattern 60 is removed. Then, an additional photoresist layer 70 is formed over the resultant structure without the photoresist pattern 60. As the additional photoresist layer 70 is formed over the entire resultant structure, a planarization effect is achieved.

Figure 4C:
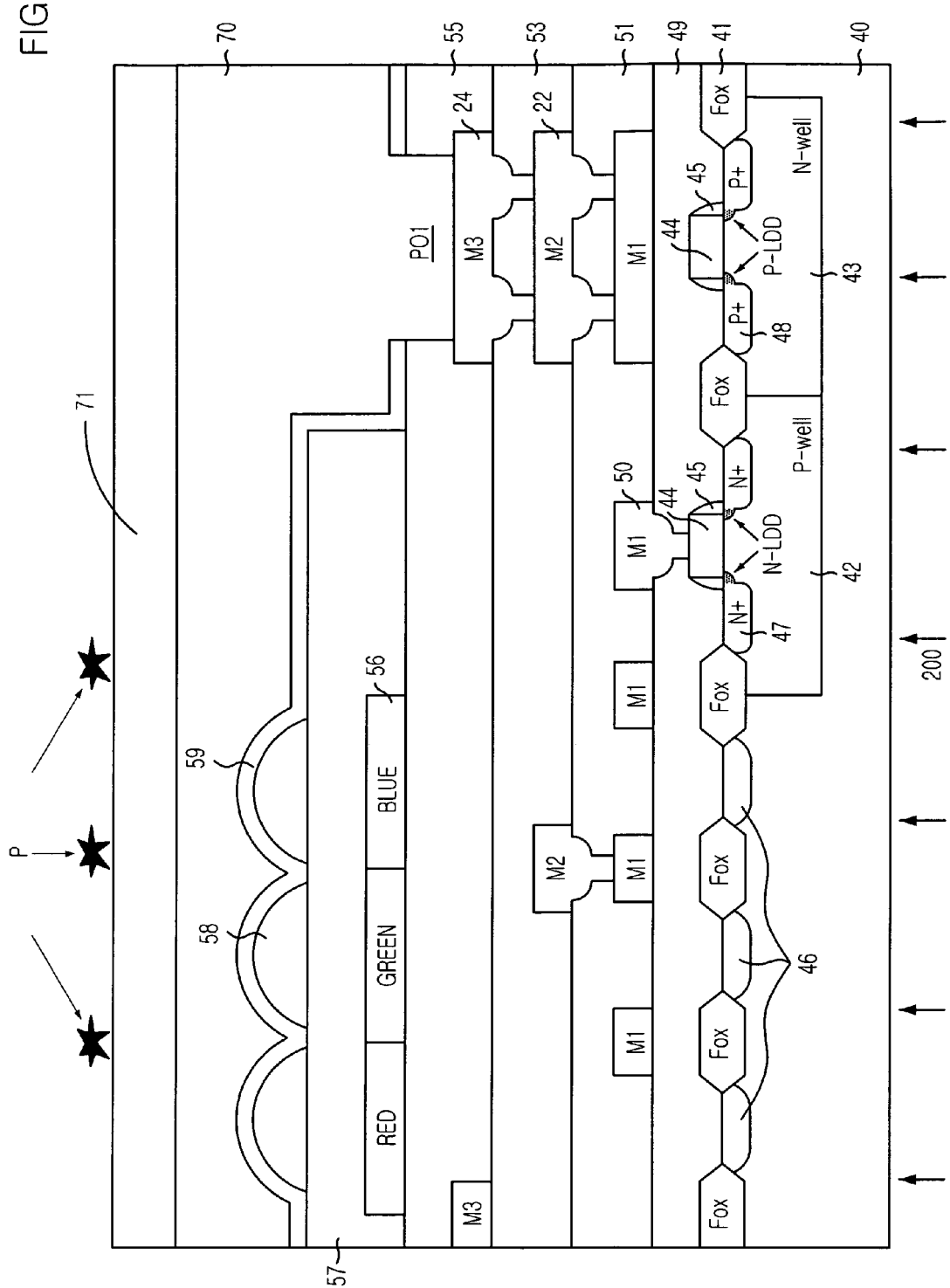

Referring to FIG. 4C, a taping process is performed to glue a tape 71 on the additional photoresist layer 70. Since the resultant structure is planarized, the tape 71 can be glued without being affected by a height difference between the patterns. A wafer back grinding process 200 is performed. Performing the wafer back grinding process 200 after the taping process can reduce contamination in an image sensor chip since particles P generated during the wafer back grinding process 200 are adhered on the tape 71. Also, the additional photoresist pattern 70 covers the pad open unit PO1, the tape 71 in liquid form cannot penetrate into the pad open unit PO1.

Figure 1:
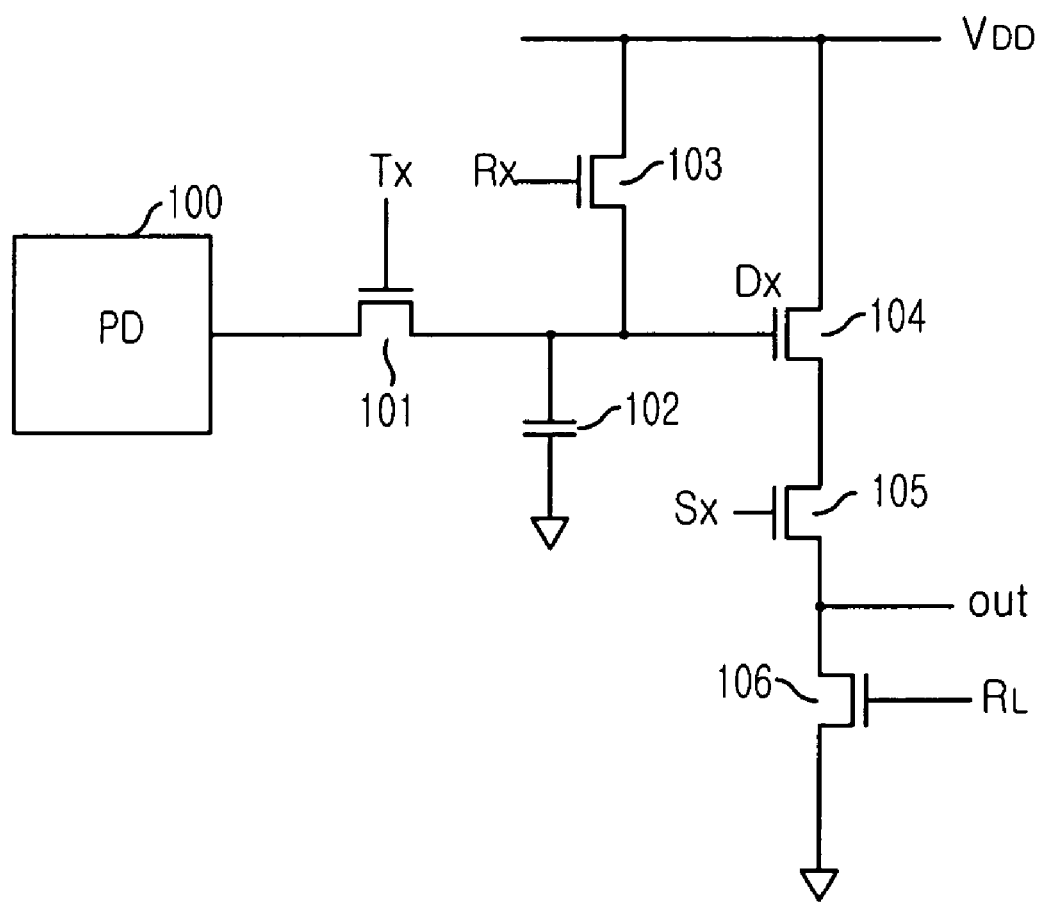
FIG. 1 is a circuit diagram illustrating a unit pixel of a conventional CMOS image sensor.
Figure 2A:
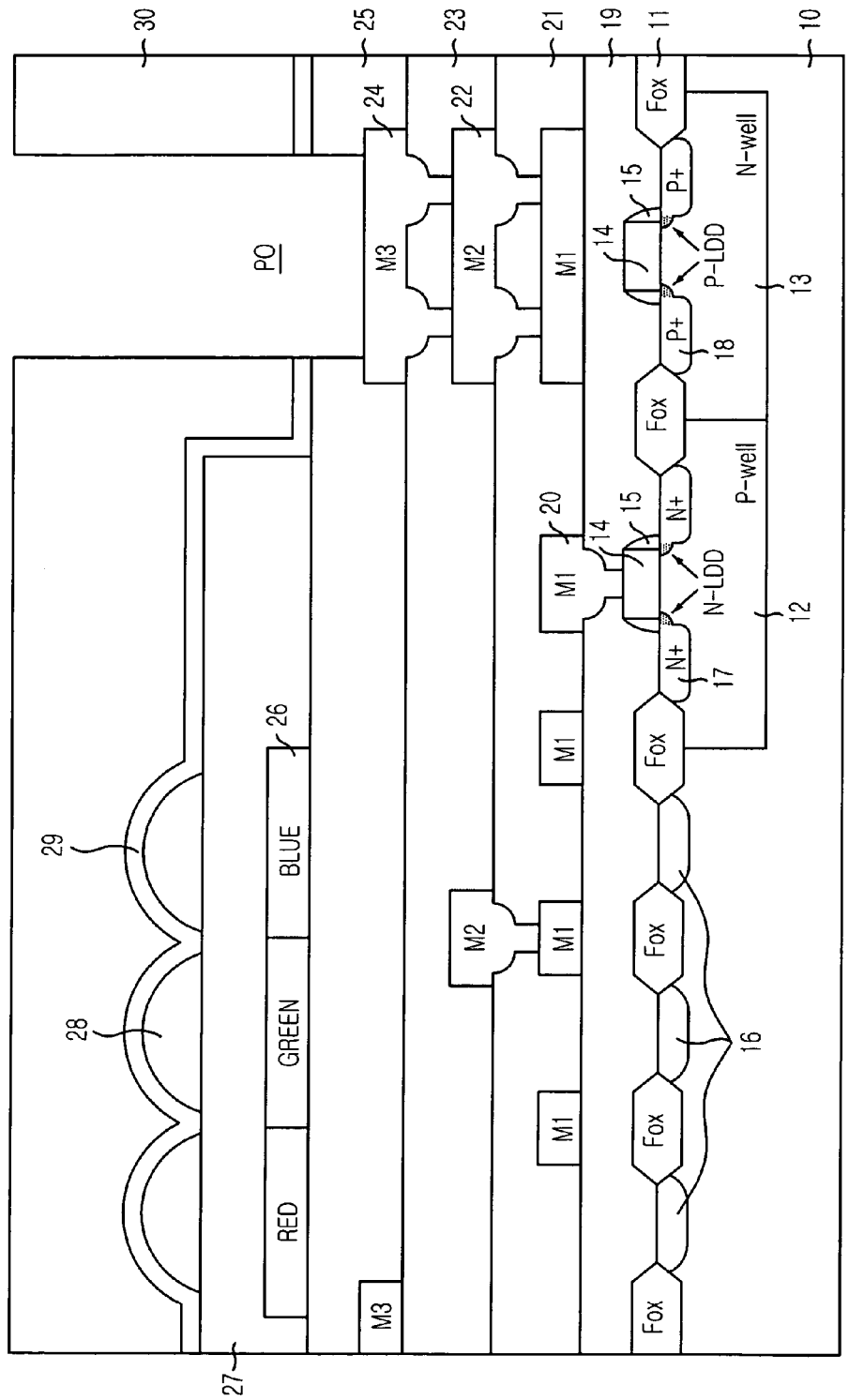
FIGS. 2A to 2C are cross-sectional views illustrating a method for fabricating a conventional image sensor.
Figure 2B:
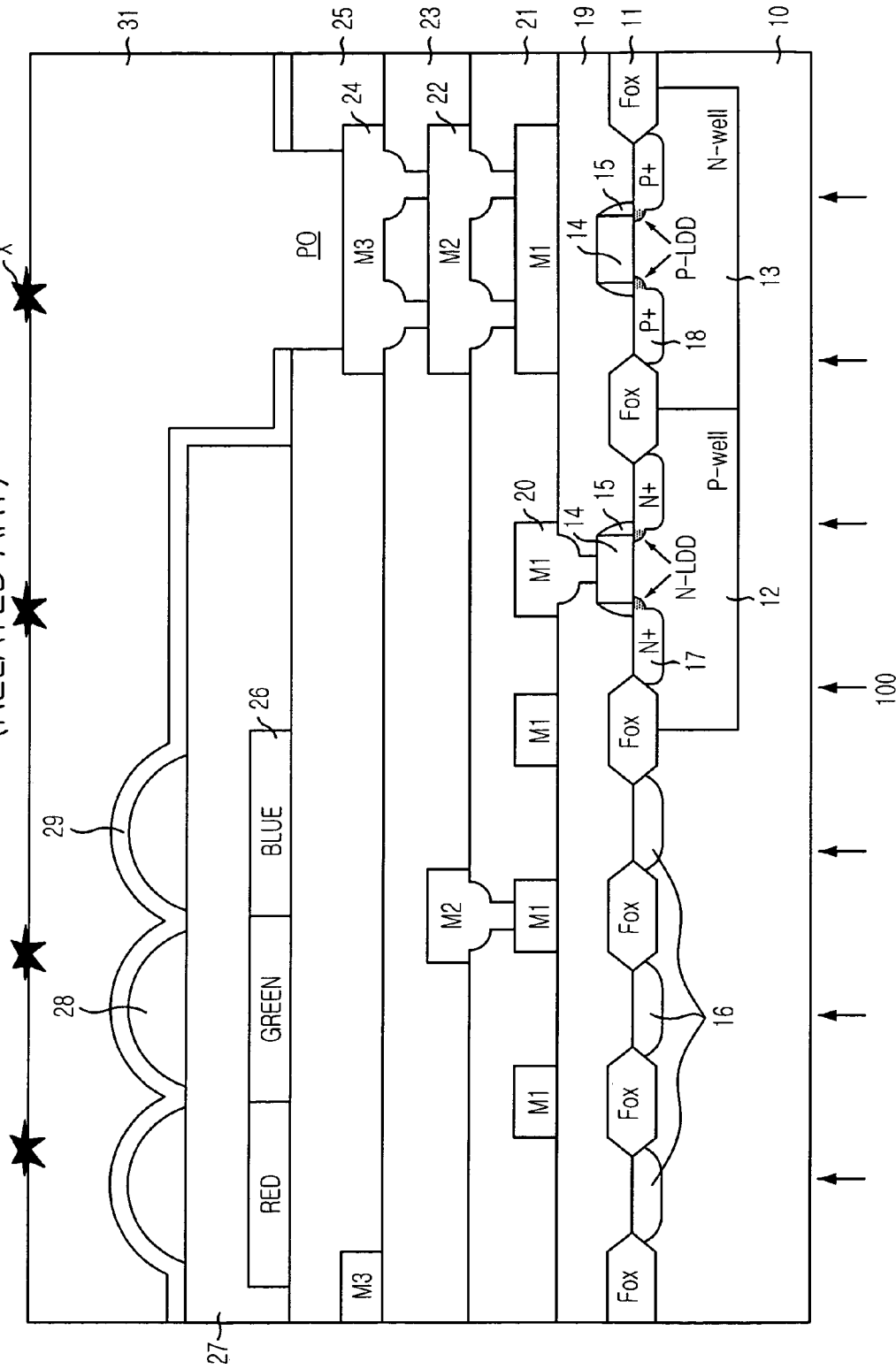
Figure 2C:
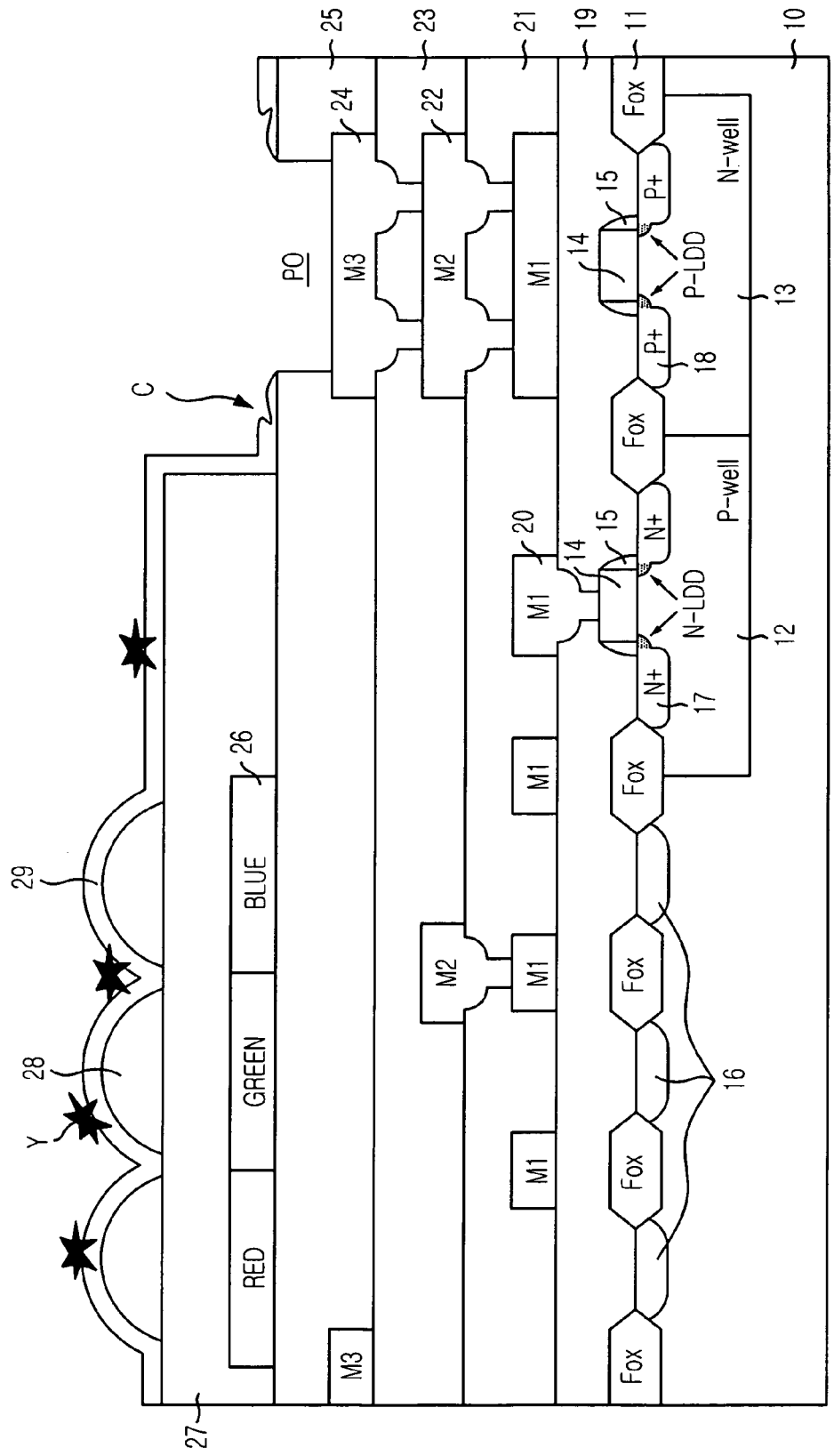
Figure 3A:
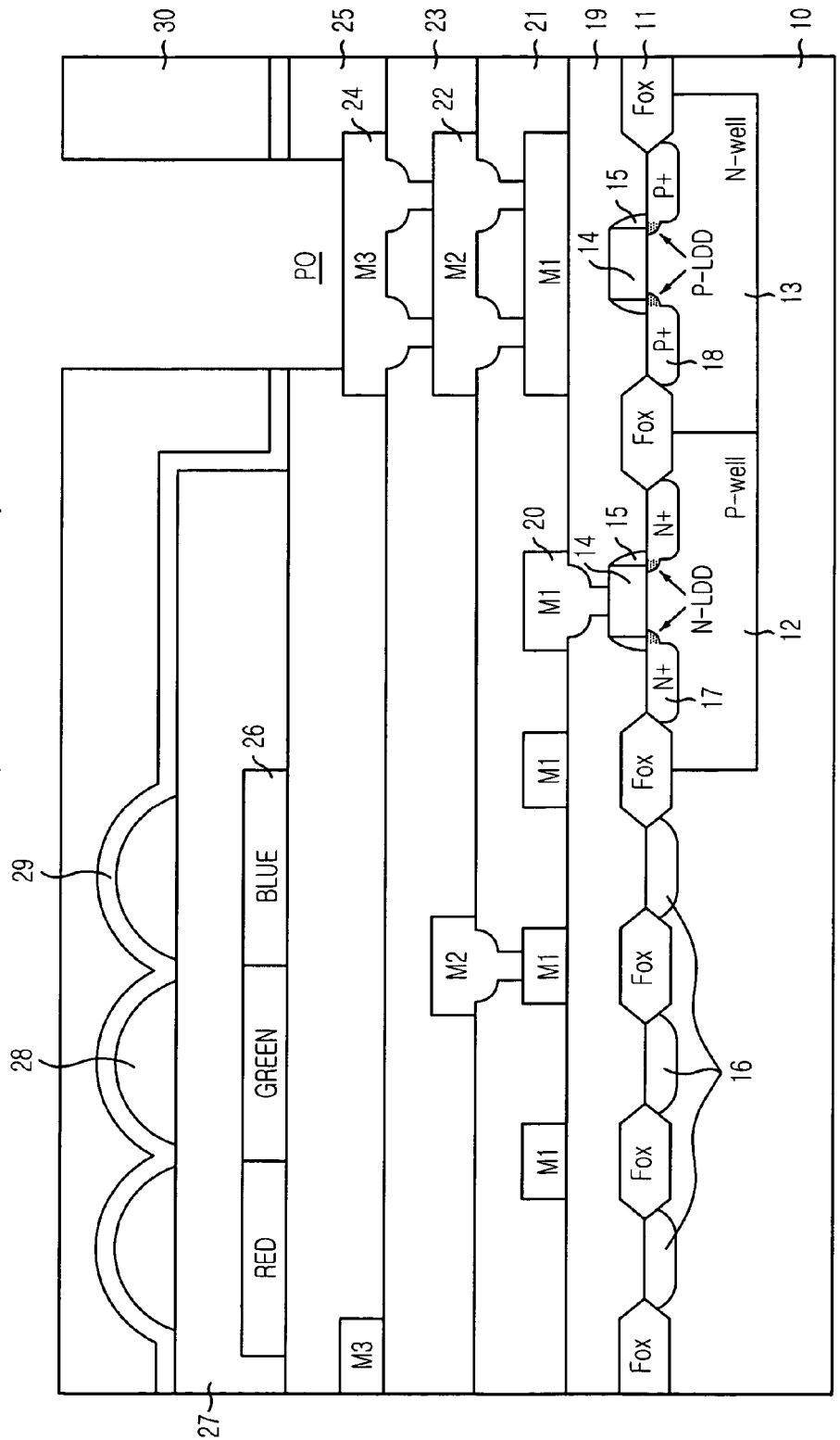
FIGS. 3A to 3C are cross-sectional views illustrating a method for fabricating another method for improving disadvantages arising when performing a conventional wafer back grinding process.
Figure 3B:
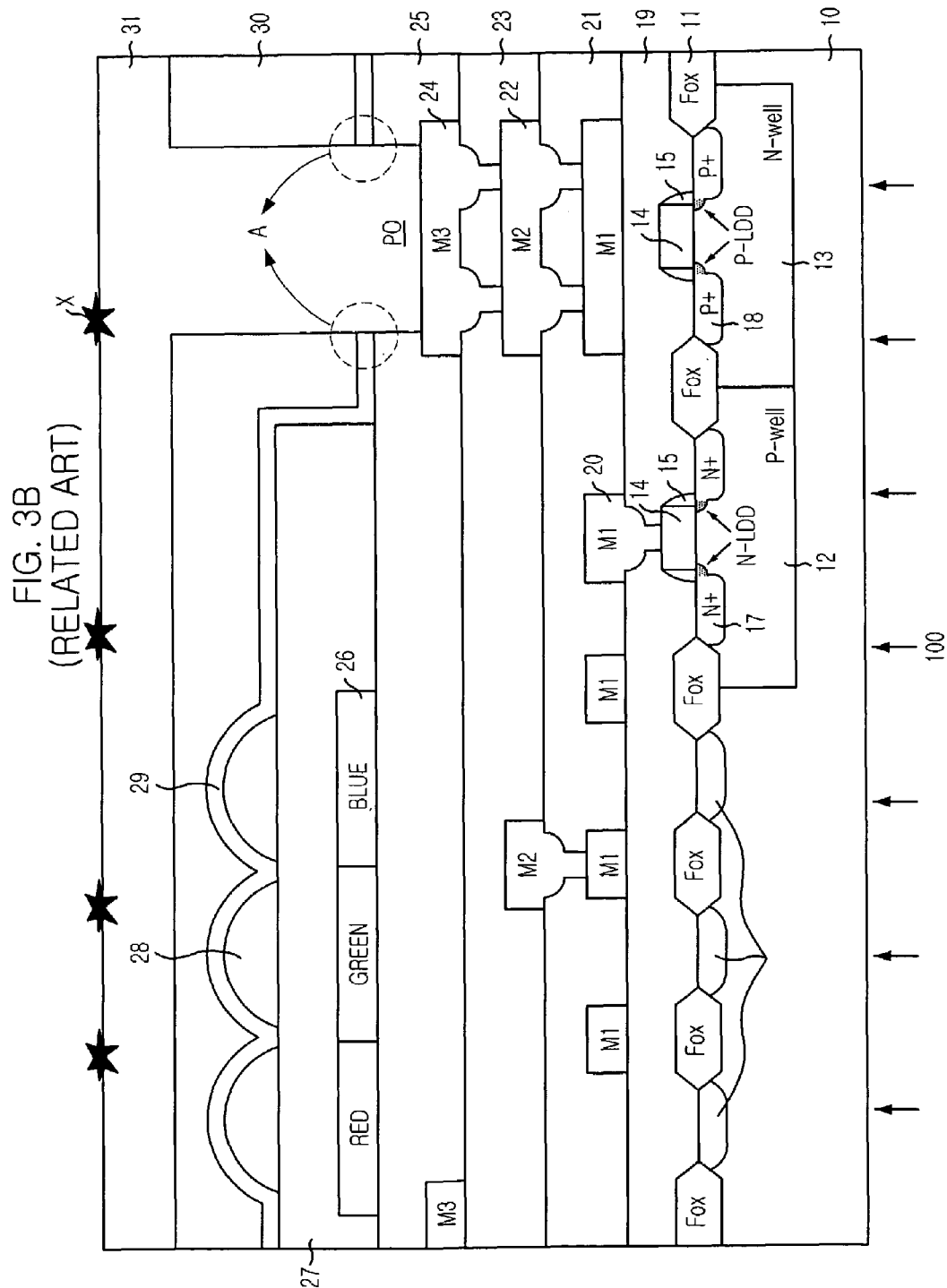
Figure 3C:
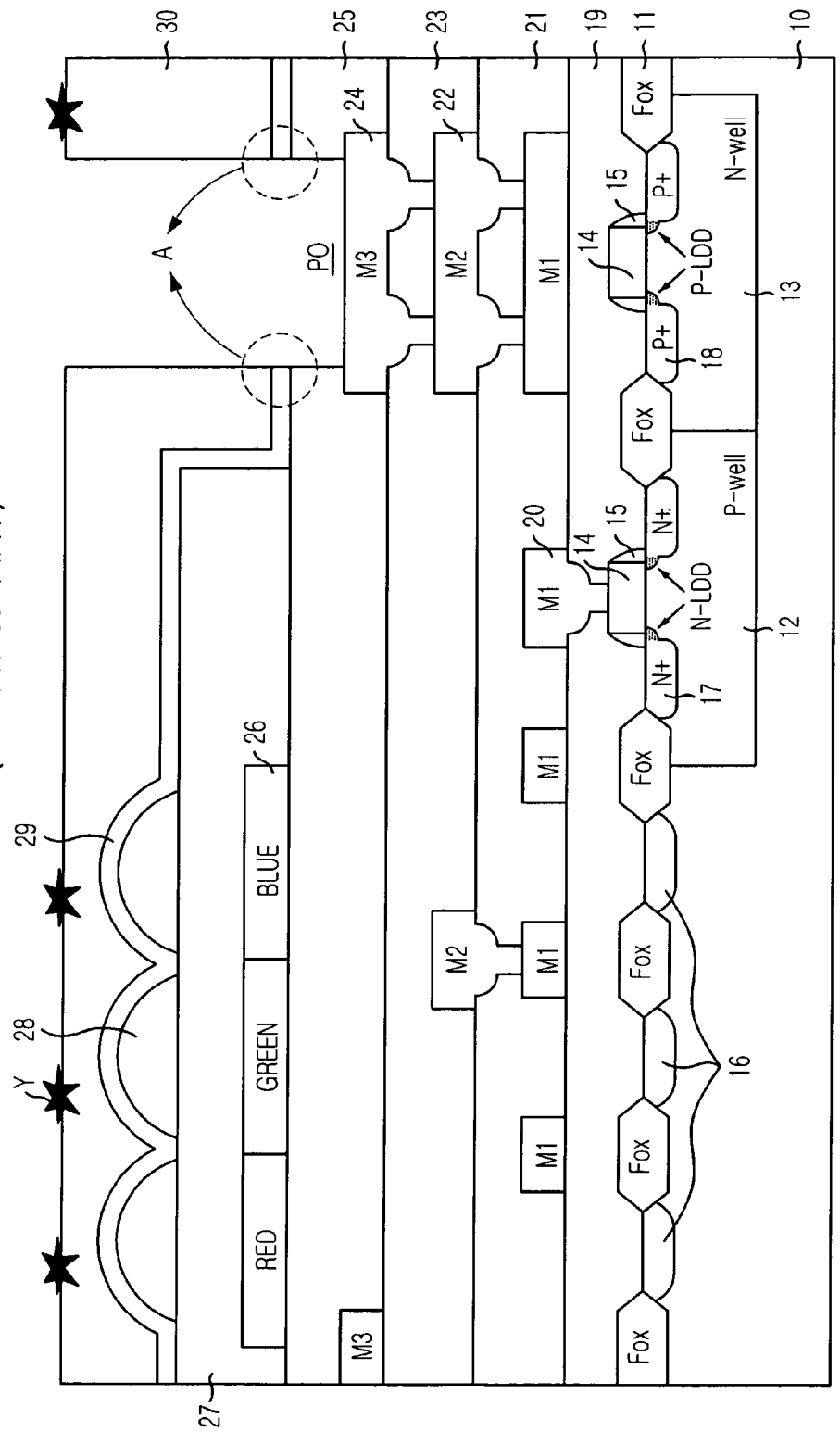

The tape 71 is removed, and a cleaning process is performed thereafter. In the conventional method, the tape 31 generally penetrates into the pad open unit PO, the microlens protection layer 29 tends to be cracked or lifted up during the removal of the tape 31 (refer to FIG. 3B). On the contrary, according to the present embodiment, the tape 71 does not penetrate into the pad open unit PO1, the microlens protection layer 59 in the pad open unit PO1 is less likely to be cracked or lifted up. Also, adhesive residues of the tape 71 remains on the additional photoresist layer 70, and thus, device characteristics are not deteriorated.

Figure 4D:
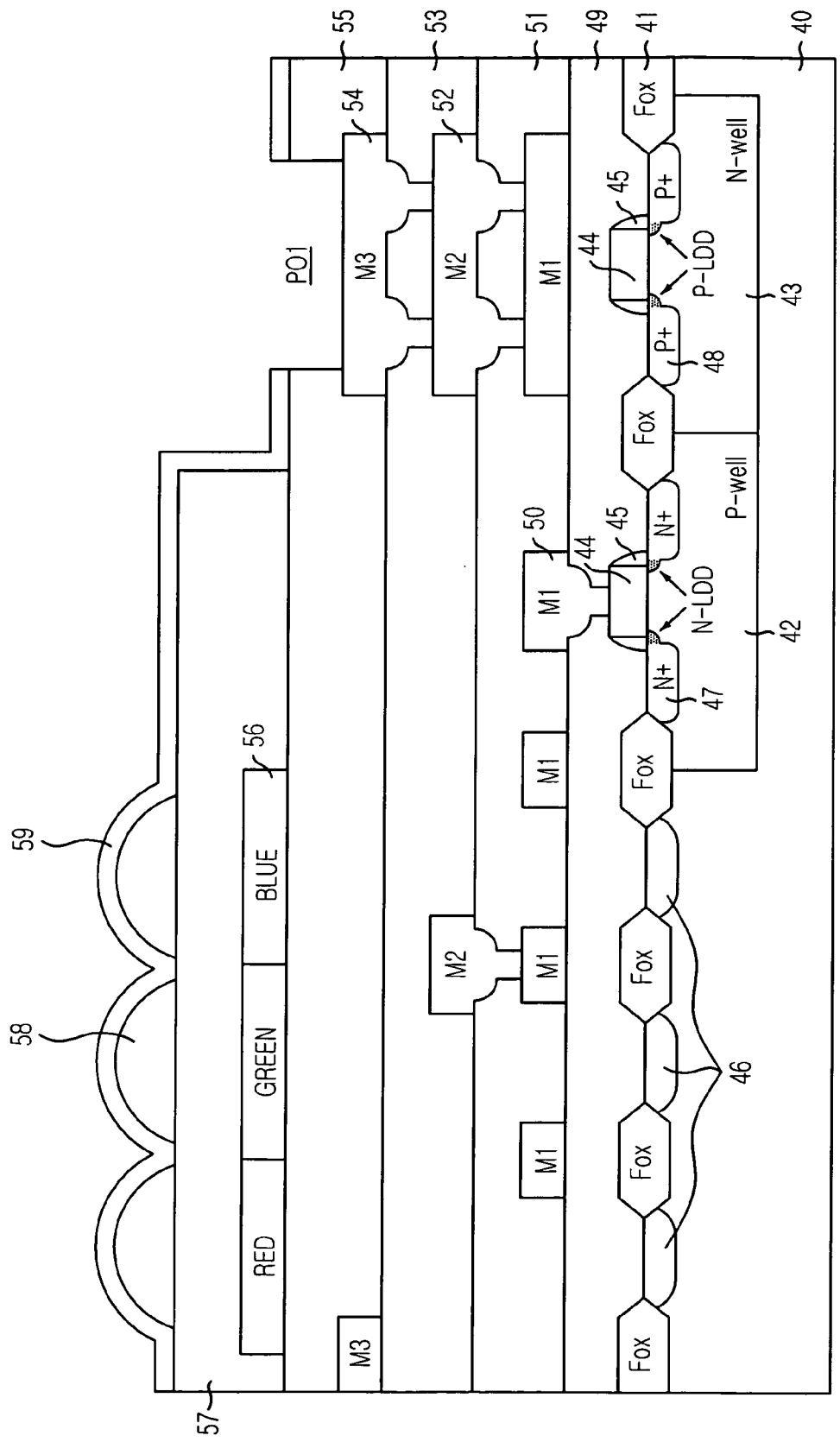

Referring to FIG. 4D, the additional photoresist layer 70 is removed by a wet etching process and cleaned thereafter. The wet etching process of removing the additional photoresist layer 70 is implemented to a certain number of wafers (e.g., 25 sheets of wafers) grouped within a cassette. Thus, compared with the conventional method implemented individually to a single wafer, a broken-wafer incidence is less likely to occur.

In more detail, instead of stripping (removing) the photoresist layer of each wafer with the decreased total thickness using an arm of a designated apparatus for the photoresist stripping process, the photoresist stripping process (e.g., a wet photoresist stripping method) is performed per cassette. Hence, it is possible to reduce an occurrence of the broken-wafer incidence. In addition to CMOS image sensors, the present embodiment can be applicable to other types of image sensors such as CCDs to which the wafer back grinding process can be implemented.

On the basis of the present embodiment, a pad opening process is performed using a photoresist pattern, which is removed subsequently. An additional photoresist layer is formed to planarize the previously formed patterns over the substrate. A taping process and a wafer back grinding process are performed sequentially thereon. These sequential processes can reduce contamination by particles and increase device yield. Also, adhesive residues of the photoresist layer remain only on the additionally formed photoresist layer, and thus, device characteristics are not degraded. Since a liquid type tape is not filled into a pad open unit, a microlens protection layer in the pad open unit is less likely to be cracked or lifted up while the tape is removed.

A photoresist stripping process is not performed one wafer by one wafer using an arm of a designated apparatus for the photoresist stripping process. Rather, the photoresist stripping process proceeds with a wet photoresist stripping method, which enables stripping of the photoresist layer whose total thickness is reduced in the unit of a cassette including a certain number of sheets of wafer, the wafers are not likely to be broken.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating an image sensor comprising:
   forming a microlens protection layer over a substrate structure including a light sensing device and other associated devices;
   opening a pad open unit of the substrate structure using a mask;
   removing the mask;
   forming a photoresist layer over the entire substrate structure with the microlens protection layer;
   gluing a tape on the photoresist layer;
   performing a wafer back grinding process; and
   removing the tape and the photoresist layer.

2. The method of claim 1, wherein the image sensor is a complementary metal oxide semiconductor (CMOS) image sensor.

3. The method of claim 1, wherein the image sensor is a charge coupled device.

4. The method of claim 1, wherein the removing the photoresist layer proceeds with a wet etching method performed per cassette.

5. The method of claim 1, wherein the mask used to open the pad open unit includes a photoresist layer.

6. A method for fabricating an image sensor comprising:
   forming a microlens protection layer over a substrate structure including a light sensing device and other associated devices;
   opening a pad open unit of the substrate structure using a mask;
   removing the mask;
   forming a photoresist layer over the substrate structure with the microlens protection layer;
   gluing a tape on the photoresist layer;
   performing a wafer back grinding process subsequent to the gluing of the tape on the photoresist layer; and
   removing the tape and the photoresist layer.

* * * * *

UNITED STATES PATENT AND TRADEMARK OFFICE
CERTIFICATE OF CORRECTION

PATENT NO. : 7,449,357 B2  Page 1 of 1
APPLICATION NO. : 11/399941
DATED : November 11, 2008
INVENTOR(S) : Kim et al.

It is certified that error appears in the above-identified patent and that said Letters Patent is hereby corrected as shown below:

Title Page, Item [56], Under U.S. Patent Documents, please delete "Saho" and insert --Shao--.

Signed and Sealed this

Twelfth Day of May, 2009

JOHN DOLL
*Acting Director of the United States Patent and Trademark Office*